US008154291B2

(12) United States Patent
Chmielewski et al.

(10) Patent No.: US 8,154,291 B2
(45) Date of Patent: Apr. 10, 2012

(54) INHERENTLY DECOUPLED SOLENOID PAIR ELEMENTS

(75) Inventors: Thomas Chmielewski, Stow, OH (US); Brian J. Cohen, Stow, OH (US); Yiping Guan, Aurora, OH (US)

(73) Assignee: Hitachi Medical Systems America, Inc., Twinsburg, OH (US)

( * ) Notice: Subject to any disclaimer, the term of this patent is extended or adjusted under 35 U.S.C. 154(b) by 1236 days.

(21) Appl. No.: 11/843,744

(22) Filed: Aug. 23, 2007

(65) Prior Publication Data

US 2009/0054759 A1    Feb. 26, 2009

(51) Int. Cl.
*G01V 3/00*    (2006.01)
(52) U.S. Cl. ......................................... 324/318; 324/322
(58) Field of Classification Search .......... 324/300–322; 600/407, 410, 419–422
See application file for complete search history.

(56) References Cited

U.S. PATENT DOCUMENTS

| | | | |
|---|---|---|---|
| 6,611,186 B2 * | 8/2003 | Hanson et al. ................ | 335/220 |
| 6,701,177 B2 * | 3/2004 | Su ................................. | 600/422 |
| 6,751,496 B2 * | 6/2004 | Su et al. ........................ | 600/422 |
| 6,836,118 B2 * | 12/2004 | Molyneaux et al. .......... | 324/319 |
| 7,042,222 B2 * | 5/2006 | Zheng et al. .................. | 324/318 |
| 7,091,721 B2 * | 8/2006 | Jevtic ............................ | 324/318 |
| 7,235,973 B2 * | 6/2007 | Chmielewski et al. ....... | 324/318 |
| 7,446,528 B2 * | 11/2008 | Doddrell et al. .............. | 324/318 |
| 7,970,452 B2 * | 6/2011 | Piron et al. .................... | 600/411 |
| 2002/0169374 A1 | 11/2002 | Jevtic | |
| 2004/0212366 A1 | 10/2004 | Molyneaux et al. | |
| 2007/0016003 A1 | 1/2007 | Piron et al. | |
| 2010/0033183 A1 * | 2/2010 | Ochi et al. .................... | 324/313 |

OTHER PUBLICATIONS

International Search Report and Written Opinion of the International Searching Authority, International Application No. PCT/US2008/067502, mailed on Sep. 10, 2008.
Magnetic Resonant in Medicine (16, 192-225) (with PubMed Abstract), The NMR Phased Array, Roemer et al., 1990.
Roemer, et al , The NMR Phased Array, Magnetic Resonant in Medicine, 1990, pp. 192-225.

* cited by examiner

*Primary Examiner* — Brij Shrivastav
(74) *Attorney, Agent, or Firm* — Ulmer & Berne LLP

(57) ABSTRACT

The present invention relates to an element configuration within an RF coil for use for MRI. The invention provides for an inherently electromagnetically decoupled solenoid element pair for receiving radio frequency magnetic resonance signals within a vertical field MRI system. The elements of the solenoid element pair described herein are typically positioned in a coplanar, side-by-side position. The decoupling of the solenoid pair can be accomplished through numerous methods including but not limited to an overlapping between the elements of the solenoid pair, use of a capacitor shared between the elements of the solenoid pair, or the use of overlapped inductors between the elements of the solenoid pair.

25 Claims, 11 Drawing Sheets

INHERENTLY DECOUPLED SOLENOID PAIR ELEMENTS

TECHNICAL FIELD

The invention relates generally to an element configuration within a radio frequency receive coil for use for magnetic resonance imaging. More specifically, the invention relates to an inherently electromagnetically decoupled solenoid pair element for receiving radio frequency magnetic resonance signals within a vertical field magnetic resonance imaging system.

BACKGROUND OF THE INVENTION

Magnetic resonance imaging (MRI) is a medical diagnostic imaging technique used to diagnose many types of injuries and medical conditions. An MRI system includes a main magnet for generating a main magnetic field through an examination region. The main magnet is arranged such that its geometry defines the examination region. The orientation of the main magnet defines whether the MRI system is classified as a horizontal field system or a vertical field system. In a horizontal field system, the static main magnetic field is typically oriented in the head-foot (H-F) direction relative to the prone/supine patient within the system. In a vertical field system, the static magnetic field is typically oriented in an anterior-posterior (A-P) direction relative to the prone/supine patient within the system.

The main magnetic field causes the magnetic moments of a small majority of the various nuclei within the body to be aligned in a parallel or anti-parallel arrangement. The aligned magnetic moments rotate around the equilibrium axis with a frequency that is characteristic for the nuclei to be imaged. An external radiofrequency (RF) field applied by other hardware within the MRI system perturbs the magnetization from its equilibrium state. Upon termination of the application of the RF pulse, the magnetization relaxes to its initial state. During relaxation the time varying magnetic moment induces a detectable time varying voltage in the receive coil. The time varying voltage is commonly detected by a RF receive coil.

During operation of the RF receive coil, each element within the coil collects information from the time varying voltage induced by the magnetic moments within the anatomy of the patient nearest to that element. The information collected by each element is processed through the electronics within the MRI system on individual channels of the MRI system, which keep the information from each element separate throughout the imaging process. The information from each channel of the system is then processed by reconstruction software integrated with the MRI system to combine the single images from the channels to create a complete image of the anatomy of interest.

One or more RF receive coils, commonly called imaging coils, are typically placed within the vicinity of the patient during imaging. The imaging coil is typically comprised of a series of inductive and capacitive elements and operates by resonating and efficiently storing energy at what is known as the Larmor frequency. The imaging coil is comprised of at least one, and usually more than one element typically made of a continuous piece of copper in a solenoid, loop, butterfly or figure-eight (saddle), or other continuous geometric shape. The elements are positioned at various locations throughout the coil to provide for the desired imaging of the patient. The design of the receive coil varies depending on whether it is designed for use within a vertical or horizontal field MRI system.

The shape, configuration and location of elements within the receive coil affect the characteristics of the coil, including the coil sensitivity, signal-to-noise ratio (SNR) and imaging field-of-view. Conventionally, the receive coil's imaging field-of-view (FoV) is defined as the distance between the two points on the coil sensitivity profile, which is a graph of the coil's sensitivity over the distance profile, where the signal drops to 80% of its peak value. Smaller elements typically provide higher sensitivity and SNR, but decreased FoV, while larger elements provide lower sensitivity and SNR, over a larger FoV. Considering this, receive coils commonly utilize numerous smaller elements positioned over the entirety of the coil, rather than very few larger elements that cover the entirety of the coil.

When two individual elements having the same resonance frequency are brought in close proximity to each other, the common resonance frequency starts to split into two separate frequencies due to the electromagnet interaction or coupling between the two elements. Two coils in close proximity to each other are considered to couple to one another if one element induces a net non-zero magnetic flux linkage to the other, and vice versa. Likewise, two coils are considered to be magnetically de-coupled if one element induces a net zero magnetic flux linkage to the other. De-coupled coils completely null the magnetic flux linkage between each other. Generally, the closer the coils are brought together, the stronger the coupling that occurs. Since the receive coil should have its maximum sensitivity optimized for a particular relatively narrow band of frequencies, the coupling of elements can cause sensitivity degradation when two or more elements are closely arranged within the receive coil.

Within the art, numerous attempts have been made to provide element configurations that allow for increased SNR and sensitivity, while avoiding coupling between coils. It is known within the art that overlapping adjacent coplanar surface elements is effective in reducing coupling in RF coils designed for horizontal systems, as described in "The NMR Phased Array", P. B. Roemer et al., Magnetic Resonant Medicine, 1990, 16, pp. 192-225, however it has been recognized in the art that in the past that method has not been successful in volume coils designed for use with vertical field systems. Various solutions have been provided to modify coplanar coil array configurations in coils designed for vertical field systems, such as the "figure-eight" element, and the sandwich solenoid element, as described in U.S. Pat. No. 6,751,496. Often, as is the case in the prior art with peripheral-vascular (PV), full body, and other coils that encase both of the patient's legs or feet, a single solenoid element is used within the coil to surround and image both feet and/or legs simultaneously, essentially avoiding the coupling by using a single large element rather than more than one smaller elements. However, as is known in the prior art, the signal to noise ratio of larger solenoid elements is inferior to that of smaller solenoid elements.

To date, no solution is known that allows for a decoupled element configuration that provides increased SNR and sensitivity in an RF coil using a solenoid element pair, wherein a solenoid pair of elements are coplanar in a side-by-side, or right-left (R-L) fashion along the same horizontal axis, rather than in a head-foot (H-F) fashion along the same center axis.

SUMMARY OF THE INVENTION

The present invention relates to an element configuration within a radio frequency receive coil for use for magnetic resonance imaging. The invention provides for an inherently electromagnetically decoupled solenoid element pair for receiving radio frequency magnetic resonance signals within a vertical field magnetic resonance imaging system. The elements of the solenoid element pair described herein are typically positioned in a coplanar, side-by-side position. The decoupling of the solenoid pair can be accomplished through numerous methods. The element configuration of one embodiment of the invention provides for a slight overlap between the elements of the solenoid pair to provide the necessary decoupling of the elements within the solenoid pair. The element configuration of a further embodiment of the invention provides for the use of a capacitor shared between the elements of the solenoid pair to provide the necessary decoupling of the elements within the solenoid pair. The element configuration of a further embodiment of the invention provides for the use of overlapped inductors between the elements of the solenoid pair to provide the necessary decoupling of the elements within the solenoid pair.

It is an object of this invention to provide a decoupled element configuration that provides increased SNR and sensitivity in an RF coil implementing a solenoid element pair, wherein the solenoid element pair are coplanar in a side-by-side or right-left fashion along the same horizontal axis.

It is another object of this invention to provide an element configuration that is useful in imaging relatively symmetrical portions of a patient's anatomy, such as imaging both of a patient's legs and/or feet with one RF coil, including but not limited to use within a peripheral-vascular (PV), dual-knee, dual-leg, dual-foot or other similar coils in a vertical field MRI system.

These and other objects of the present invention will become more readily apparent from a reading of the following detailed description taken in conjunction with the accompanying drawings wherein like reference numerals indicate similar parts, and with further reference to the appended claims.

BRIEF DESCRIPTION OF THE DRAWINGS

The preferred embodiment of the invention, illustrative of the best mode in which applicant has contemplated applying the principals is set forth in the following description and is shown in the drawings and is particularly and distinctly pointed out and set forth in the appended claims. The invention may take physical form in certain parts and arrangements of parts, numerous embodiments of which will be described in detail in the specification and illustrated in the accompanying drawings which form a part hereof, and wherein:

DETAILED DESCRIPTION OF THE INVENTION

Figure 1:
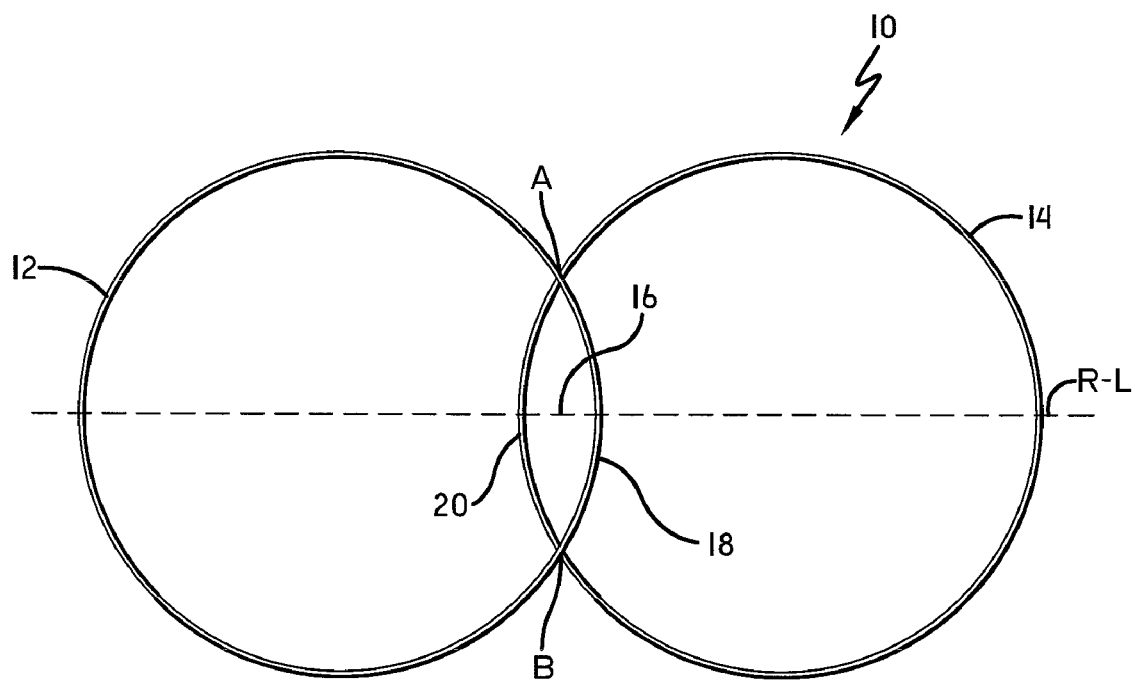
FIG. 1 is a perspective view of an embodiment of the decoupled solenoid element pair of this invention wherein an overlapped area is created by the overlapping of the two generally circular single-turn solenoid elements of the pair.

Referring now to the drawings wherein the showings are for purposes of illustrating numerous embodiments of the invention only and not for purposes of limiting the same, the figures illustrate the novel idea of an inherently electromagnetically decoupled solenoid element pair for receiving radio frequency magnetic resonance signals within a vertical field magnetic resonance imaging system. The necessary decoupling between the elements of the solenoid pair of this invention may occur through various means, as further described below.

The decoupled solenoid element pair configuration of certain preferred embodiments of this invention is effective in increasing the signal to noise ratio in a FoV that covers various portions of a patient's body, including the patient's lower body, in particular the simultaneous imaging of both legs and/or feet when configured for use with a vertical field MRI system. The element configuration, however, may be used within an RF coil designed to image any portion of the patient's body, and is not limited to use solely on the patient's lower body. Using the smaller solenoid elements of the solenoid pair of preferred embodiments of this invention provides for increased SNR than that of the previously used single solenoid element that surrounded both of the patient's legs and/or feet. As described herein, two solenoid elements are placed in a coplanar side-by-side fashion. The coplanar solenoid elements are then decoupled. Differing embodiments of the present invention provide that the decoupling of the coplanar solenoid elements may occur in a number of ways, including, but not limited to an overlapping of the solenoid elements of the coplanar pair, inductance decoupling of the solenoid elements of the coplanar pair or capacitive decoupling of the solenoid elements of the coplanar pair.

It is foreseen that similar methods as those described herein may be used in other embodiments of the invention for element configurations that include more than two elements positioned in a coplanar side-by-side fashion. For example, three, four, or even five elements can be positioned coplanarly in a side-by-side fashion, and decoupled from one another. It is also foreseen in further embodiments of the invention that more than one pair of solenoid elements may be aligned in a coplanar fashion sharing the central y-axis throughout the elements of the solenoid pairs.

Certain embodiments of the present invention put forth decoupled solenoid element pair 10, shown generally in the figures, wherein solenoid elements 12 and 14 within pair 10 are generally coplanar to each other in a right-left fashion, such that they are generally aligned on single horizontal x-axis R-L It is foreseen by embodiments of this invention that in being generally aligned on a single horizontal x-axis, the solenoid elements may be slightly angled or skewed off of the single horizontal axis as is necessary for proper placement within the housing of the RF coil The central axis running through the center of element 12 in the y-direction runs generally parallel to the central axis running through the center of element 14 in the y-direction. Each solenoid element 12 and 14 will commonly be substantially circular in shape, and created from a continuous piece of copper, as well known in the art. As is known in the art, though the solenoid is generally substantially circular in shape, various other shapes may be used including oblong, oval, rounded rectangular, or any other continuous shapes. Further embodiments of the present invention foresee use of shapes other than generally round solenoid elements. As is also known in the art, each solenoid element 12 and 14 is not required to be formed from one single piece of copper, and may be formed of numerous pieces of copper, electrically connected to act as a continuous electrical path.

Figure 2:
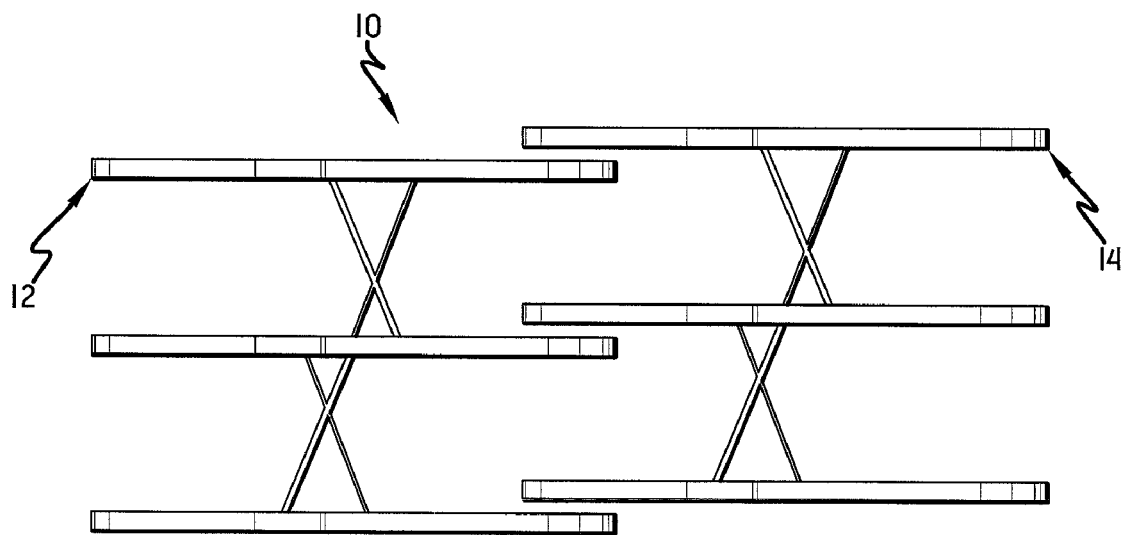
FIG. 2 is a side perspective view of an embodiment of the decoupled solenoid element pair of this invention wherein an overlapped area is created by the overlapping of the two generally circular n-turn (where n equals three in FIG. 2) solenoid elements of the pair.
Figure 3:
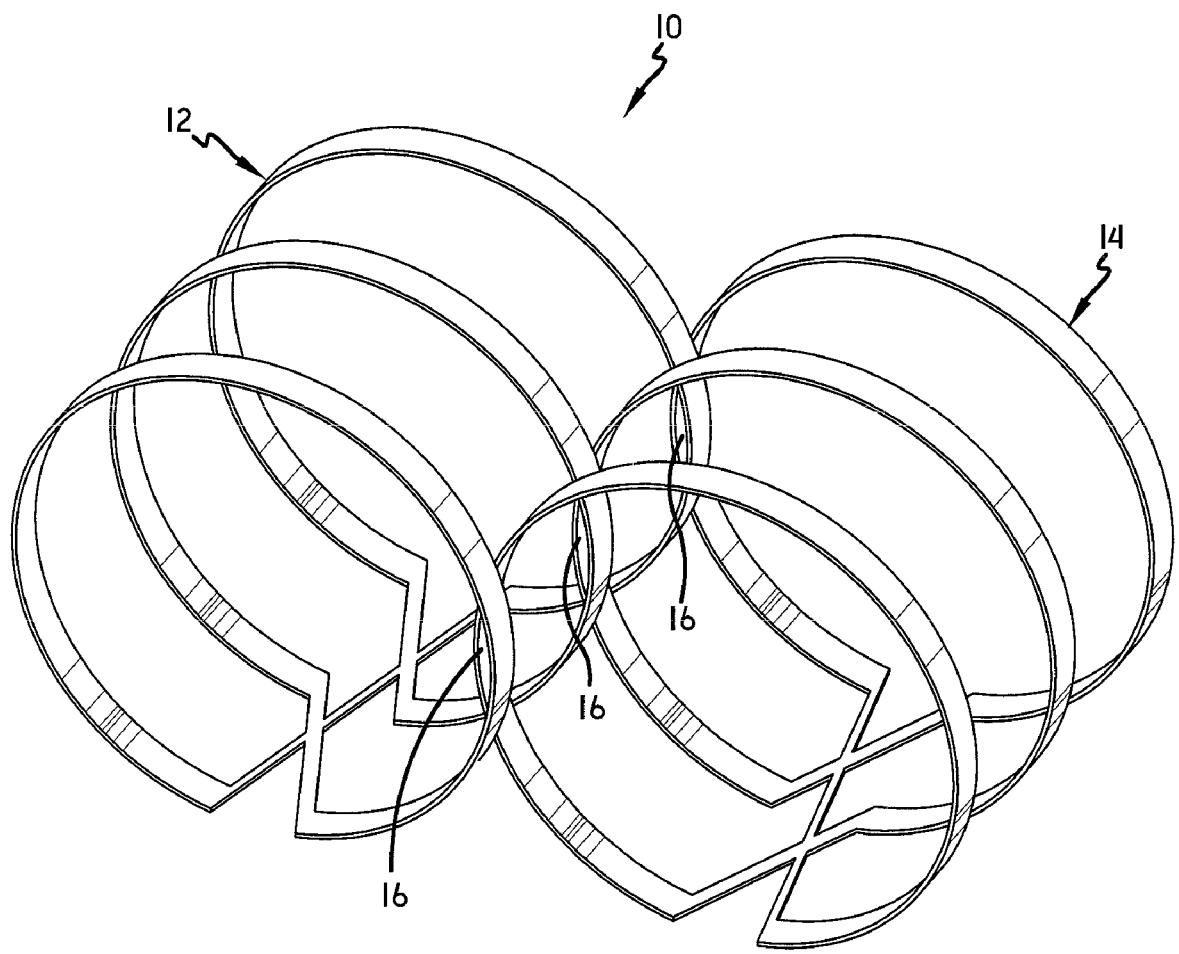
FIG. 3 is a top perspective view of the embodiment of the decoupled solenoid element pair shown in FIG. 2.
Figure 10:
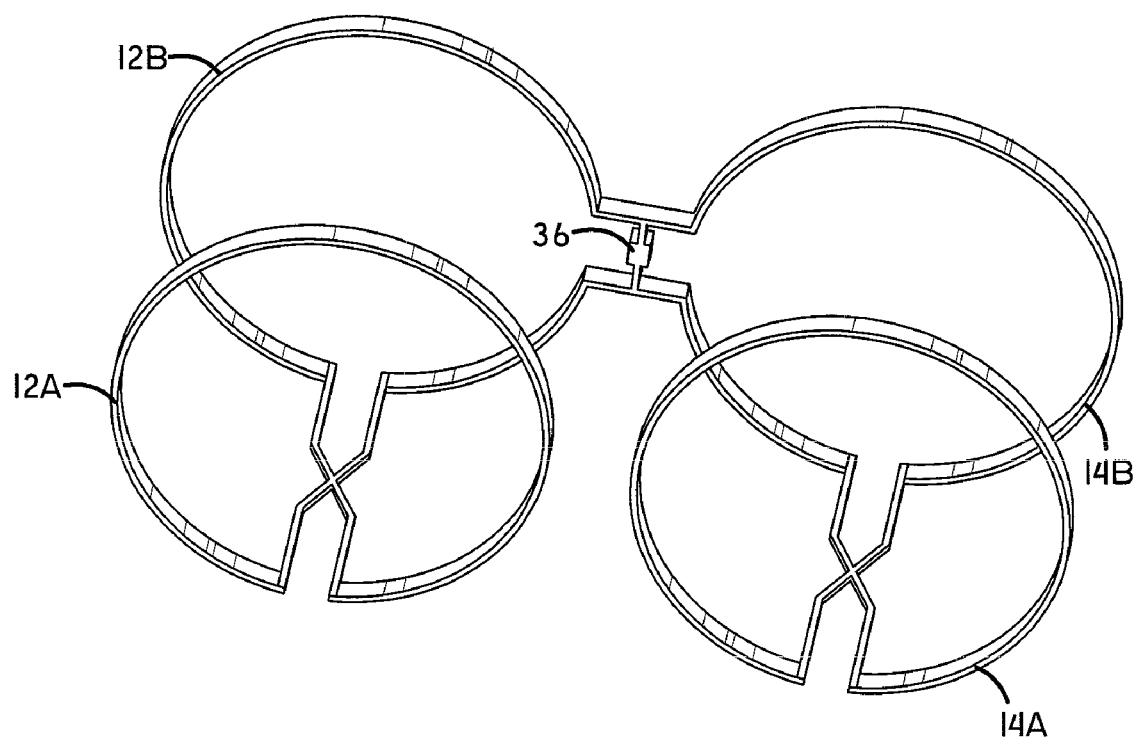
FIG. 10 is a perspective view of an embodiment of the decoupled solenoid element pair of this invention wherein a shared capacitor is used to provide the necessary decoupling between the three-turn solenoid elements of the solenoid pair.

It is foreseen that the solenoid elements 12 and 14 used within solenoid pair 10 of this invention may consist of one or more turns, as shown in FIGS. 2, 3 and 10. The number of turns used in the design of solenoid elements 12 and 14 of pair 10 do not limit the invention or affect the performance of the invention. Though single turn solenoid elements are used in many of the figures for illustration purposes, the invention is not limited by the same. It is foreseen by this invention that multi-turn solenoid elements may be used with any embodiment of the invention. Certain embodiments using multi-turn solenoid elements within the solenoid pair may benefit from the use of counter-wound solenoids, wherein the crossings of the solenoid elements are wound in the opposite direction from one another, as illustrated in FIG. 2, 3 and 10. Using the counter-wound solenoid elements may further increase the decoupling between the elements of the solenoid pair.

Within certain embodiments of the present invention, as illustrated in FIGS. 1-8, solenoid elements 12 and 14 of solenoid element pair 10 are arranged such that there is a slight overlap on the horizontal x-axis R-L, creating overlapped area 16 between elements 12 and 14. The overlap between elements 12 and 14 improves the isolation between elements 12 and 14 and decreases the coupling that occurs between elements 12 and 14. Overlapped area 16 is created when two points A and B on both elements 12 and 14 cross over each other, creating an overlap of elements 12 and 14 of solenoid element pair 10. In general, overlapped area 16 will provide adequate decoupling between elements 12 and 14 of solenoid pair 10 when the width of overlapped area 16 is approximately 5% to 15% of the width of each element 12 or 14 of solenoid pair 10. Certain widths of overlap within that range may provide for ideal or optimal decoupling of elements 12 and 14, however.

As shown in FIG. 1, current I1 through element 12 runs opposite of the current through element 14 of solenoid pair 10. When current I1 through element 12 changes with time, the electromotive force voltage (also referred to as eletromotance or e.m.f.) $E_{14}$ induced in element 14 by I1 can be determined by the following equation:

$$E_{14} = -M_{21}\frac{dI_1}{dt}$$

where $M_{21}$ is the mutual inductance between elements 12 and 14. $M_{21}$ varies with the geometry, loading and the relative position of elements 12 and 14. The larger the value of $M_{21}$, the larger the net magnetic flux change will be, increasing the coupling between elements 12 and 14. The size of overlapped area 16 can be adjusted between elements 12 and 14 such that the net magnetic flux through element 14 considering the effects of elements 12 and 14, respectively, are zero. The overlapping of elements 12 and 14 allows the elements to be decoupled while in a coplanar side-by-side position.

Figure 4:
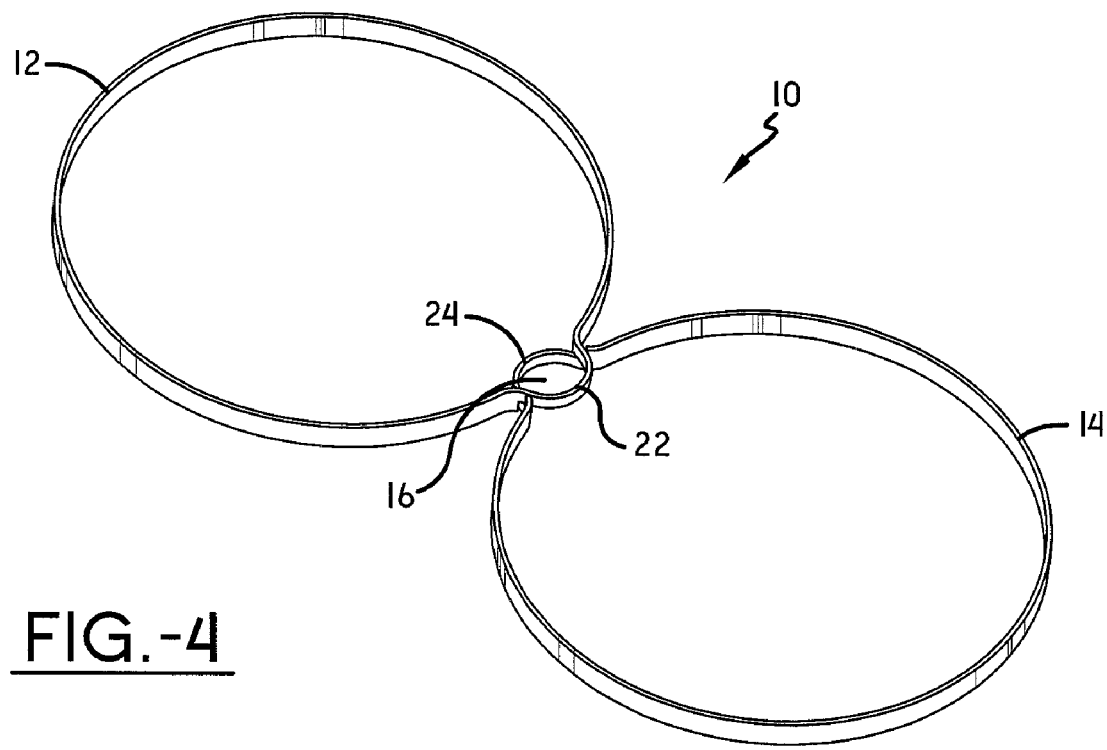
FIG. 4 is a perspective view of an embodiment of the decoupled solenoid element pair of this invention wherein an overlapped area is created between the elements of the solenoid pair by overlapping bulbous extensions protruding from each generally circular solenoid element of the pair.
Figure 5:
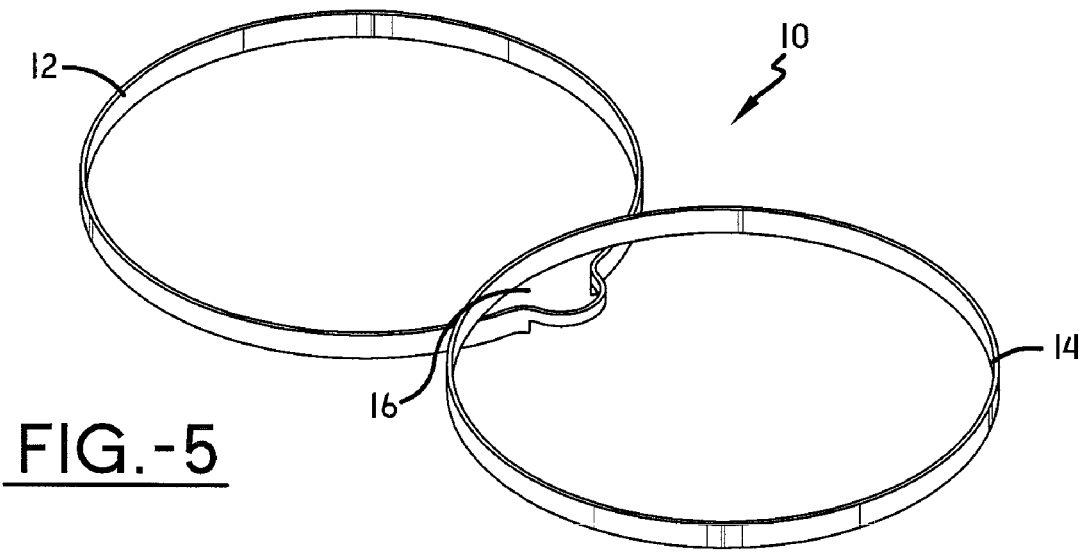
FIG. 5 is a perspective view of an embodiment of the decoupled solenoid element pair of this invention wherein an overlapped area is created by the overlapping of the bulbous extension protruding from one generally circular solenoid element and a portion of the second generally circular solenoid element of the pair.

By non-limiting example, each solenoid element 12 and 14 may be substantially circular in nature, with an edge portion 18 and 20 of each element 12 and 14, respectively, overlapping the other, as shown in FIG. 1. A further non-limiting example, as shown in FIGS. 2-3, illustrates the overlapping of three-turn solenoid elements 12 and 14 of solenoid pair 10 to form overlapped area 16 to provide decoupling between elements 12 and 14. Alternatively, by further non-limiting example, each solenoid element 12 and 14 may be substantially circular with a bulbous extension 22 and 24 protruding from each element 12 and 14, wherein the solenoid elements 12 and 14 are positioned such that bulbous extensions 22 and 24 overlap to create overlapped area 16, as shown in FIG. 4. It is further foreseen by this invention that overlapped area 16 may be created by the overlap of one generally circular element 12 and one generally circular element 14 with bulbous extension 22 wherein bulbous extension 22 is positioned to overlap a portion of element 12, as shown in FIG. 5.

In the embodiments of the invention that use at least one bulbous extension to create overlapped area 16, the bulbous extension may be of any general shape, as long as bulbous extension is a continuous part of the solenoid element to which it is attached, and does not provide any closing or other discontinuation in the continuous solenoid element to which it is attached. The bulbous extension may be generally circular in nature, oval, or any other shape that allows for a continuous extension of the solenoid element to which it is attached.

Figure 6:
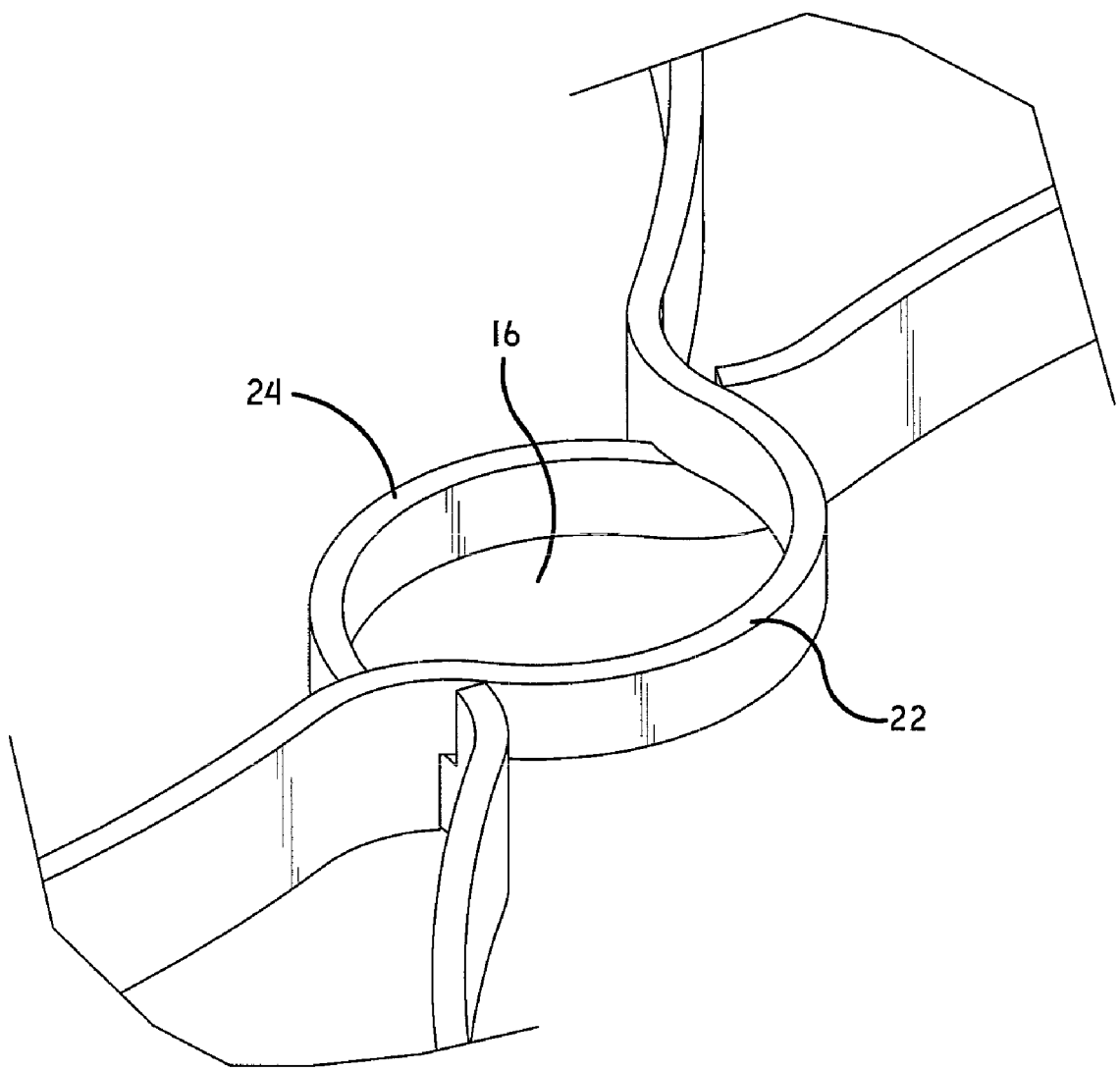
FIG. 6 is a close-up perspective view of the overlapped area created between the elements of the solenoid pair by overlapping bulbous extensions protruding from each generally circular solenoid element of the pair, of FIG. 4, wherein the elements are formed to fit together.

In certain embodiments, the creation of overlapped area 16 between elements 12 and 14 of solenoid pair 10 may necessitate a slight skewing of elements 12 and 14 off of the horizontal x-axis R-L to allow the width of the elements to overlap, however elements 12 and 14 generally remain substantially on the same x-axis R-L. In further embodiments, the elements may be formed to fit together to create overlapped area 16, as shown in FIG. 6, allowing elements 12 and 14 to remain relatively parallel on horizontal x-axis R-L without requiring the elements be skewed off of the axis.

Figure 7:
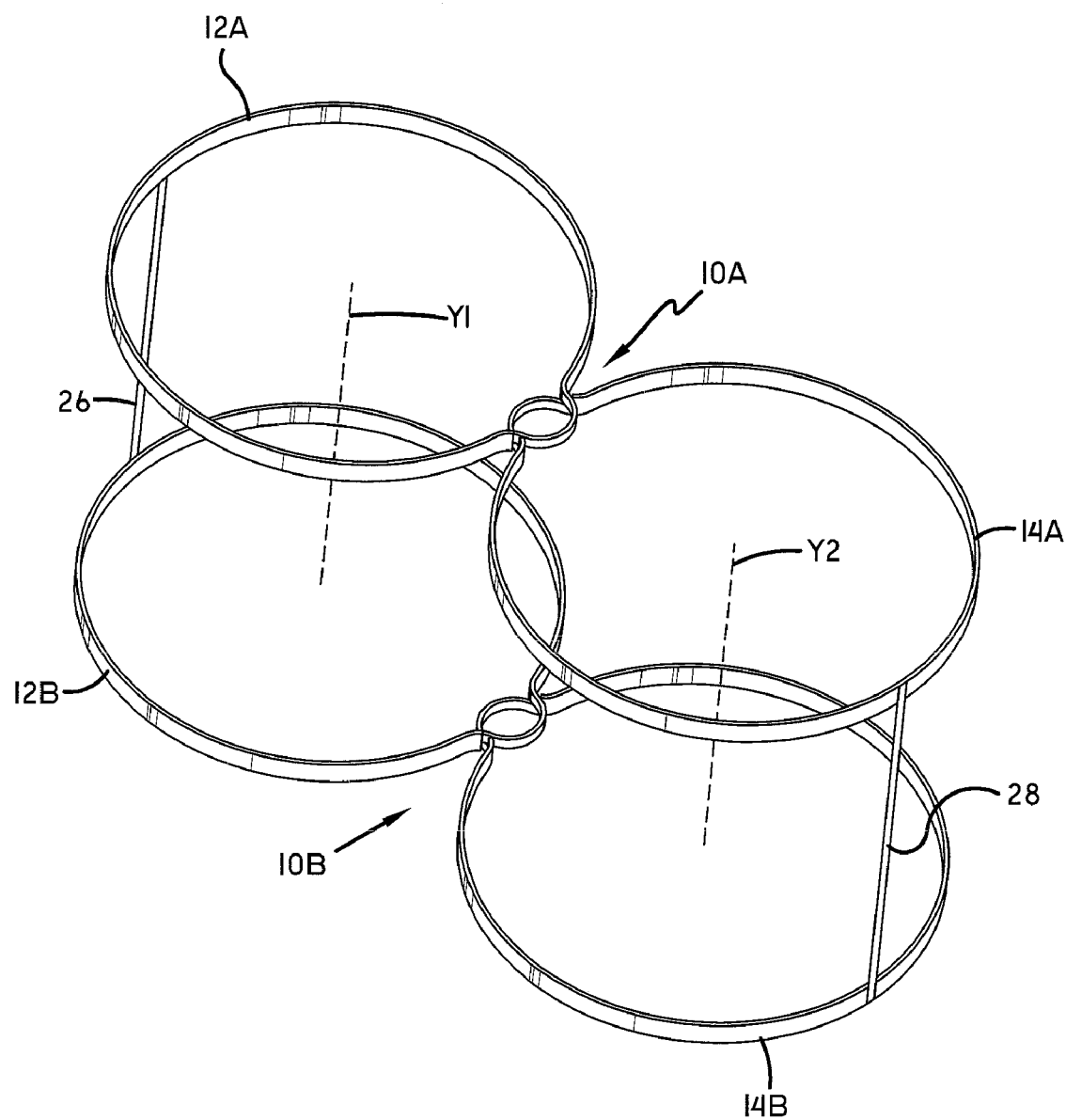
FIG. 7 is a perspective view of an embodiment of the invention showing two pairs of decoupled n-turn solenoid element pairs aligned in a coplanar fashion along the two center axis that extend through the center of each solenoid element of each solenoid element pair wherein each pair is decoupled by use of an overlapped area.
Figure 8:
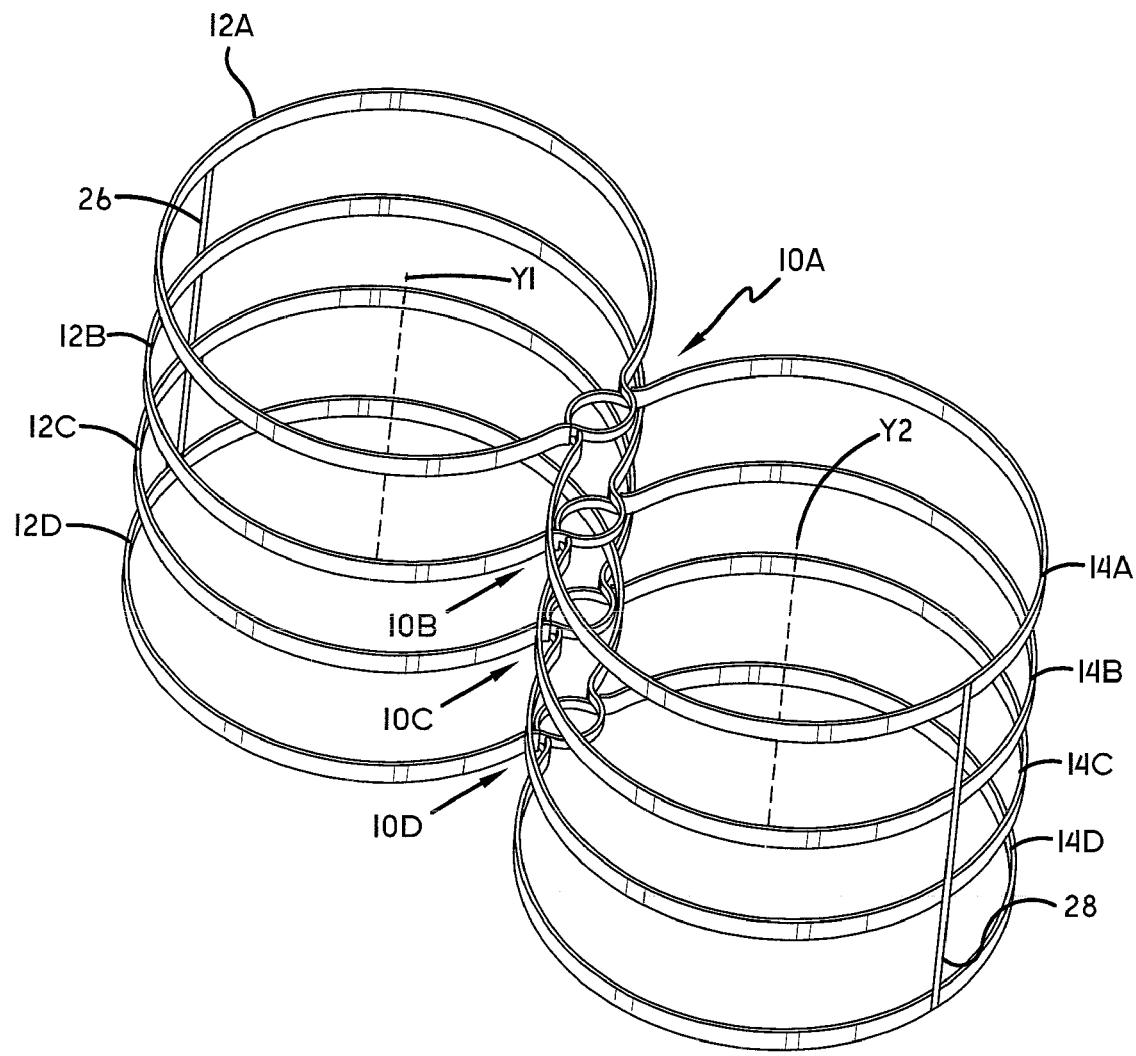
FIG. 8 is a perspective view of an embodiment of the invention showing four pairs of decoupled solenoid element pairs aligned in a coplanar fashion along the two center axis that extend through the center of each solenoid element of each solenoid element pair wherein each pair is decoupled by use of an overlapped area.

It is foreseen by further embodiments of the invention that more than one solenoid element pair 10 may be combined in a coplanar fashion, such as shown in FIGS. 7-8. The more than one solenoid element pairs 10 may be positioned in a coplanar manner such that the two center axis Y1 and Y2 extend and are shared down the center of each solenoid element that create the solenoid element pair. FIG. 7 illustrates two pairs of decoupled solenoid element pairs aligned in a coplanar fashion along the two center axis Y1 and Y2. FIG. 8 illustrates four pairs of decoupled solenoid element pairs aligned in a coplanar fashion along the two center axis Y1 and Y2.

When more than one solenoid element pairs are arranged in a coplanar fashion, each solenoid element of each pair may share a capacitor with the solenoid element of the adjacent coplanar pair that is aligned on the same center axis. These shared capacitors are necessary for the decoupling between adjacent coplanar solenoid element pairs. FIG. 7, which illustrates two decoupled solenoid element pairs 10A and 10B, provides for shared capacitor 26 between one set of solenoid elements 12A and 12B of adjacent pairs 10A and 10B and shared capacitor 28 between set of solenoid elements 14A and 14B of adjacent pairs 10A and 10B. FIG. 8, which illustrates four decoupled solenoid element pairs 10A, 10B, 10C and 10D, provides for shared capacitor 26 between solenoid elements 12A and 12B, shared capacitor 30 between solenoid elements 12B and 12C, shared capacitor 34 between solenoid elements 12C and 12D, shared capacitor 28 between solenoid elements 14A and 14B, shared capacitor 32 between solenoid elements 14B and 14C, and shared capacitor 36 between solenoid elements 14C and 14D. While the overlap section 16 is effective in decoupling the solenoid elements 12 and 14 of the element pair 10, the shared capacitor is necessary to effectively decouple between the elements that share the capacitor between the adjacent pairs. For example, in FIG. 7, overlapped area 16A effectively decouples element 12A from element 14A, and shared capacitor 26 effectively decouples element 12A from element 12B.

Figure 9:
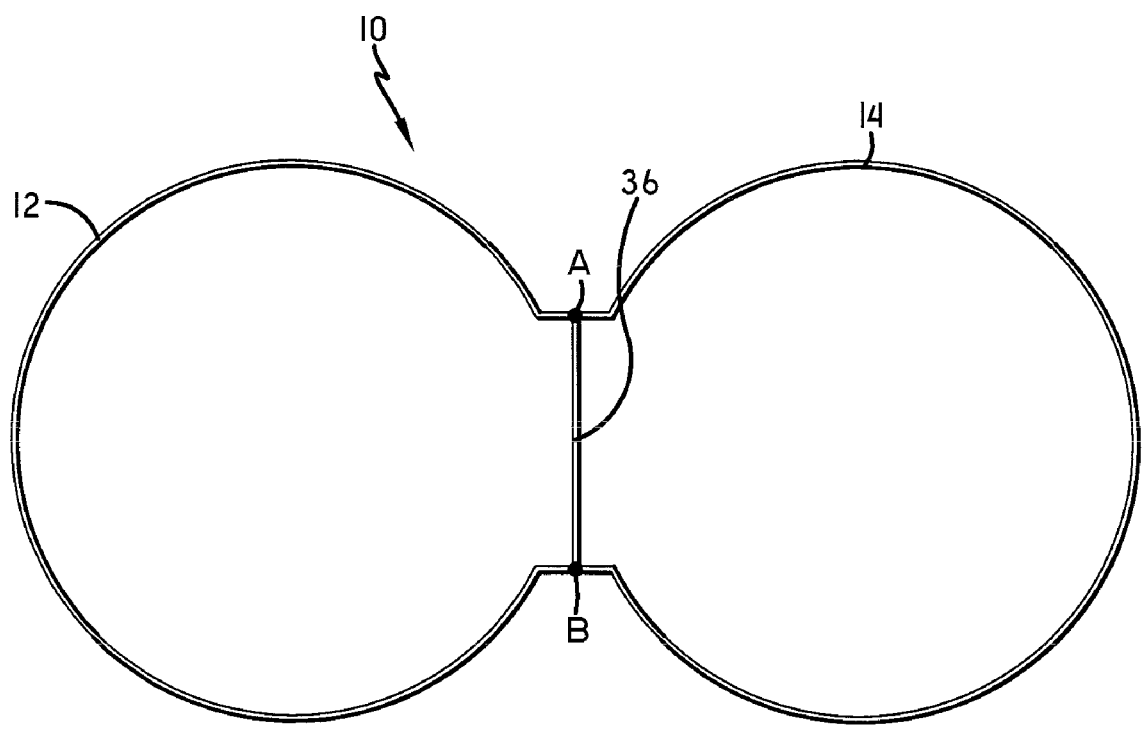
FIG. 9 is a perspective view of an embodiment of the decoupled solenoid element pair of this invention wherein a shared capacitor is used to provide the necessary decoupling between the elements of the solenoid pair.
Figure 11:
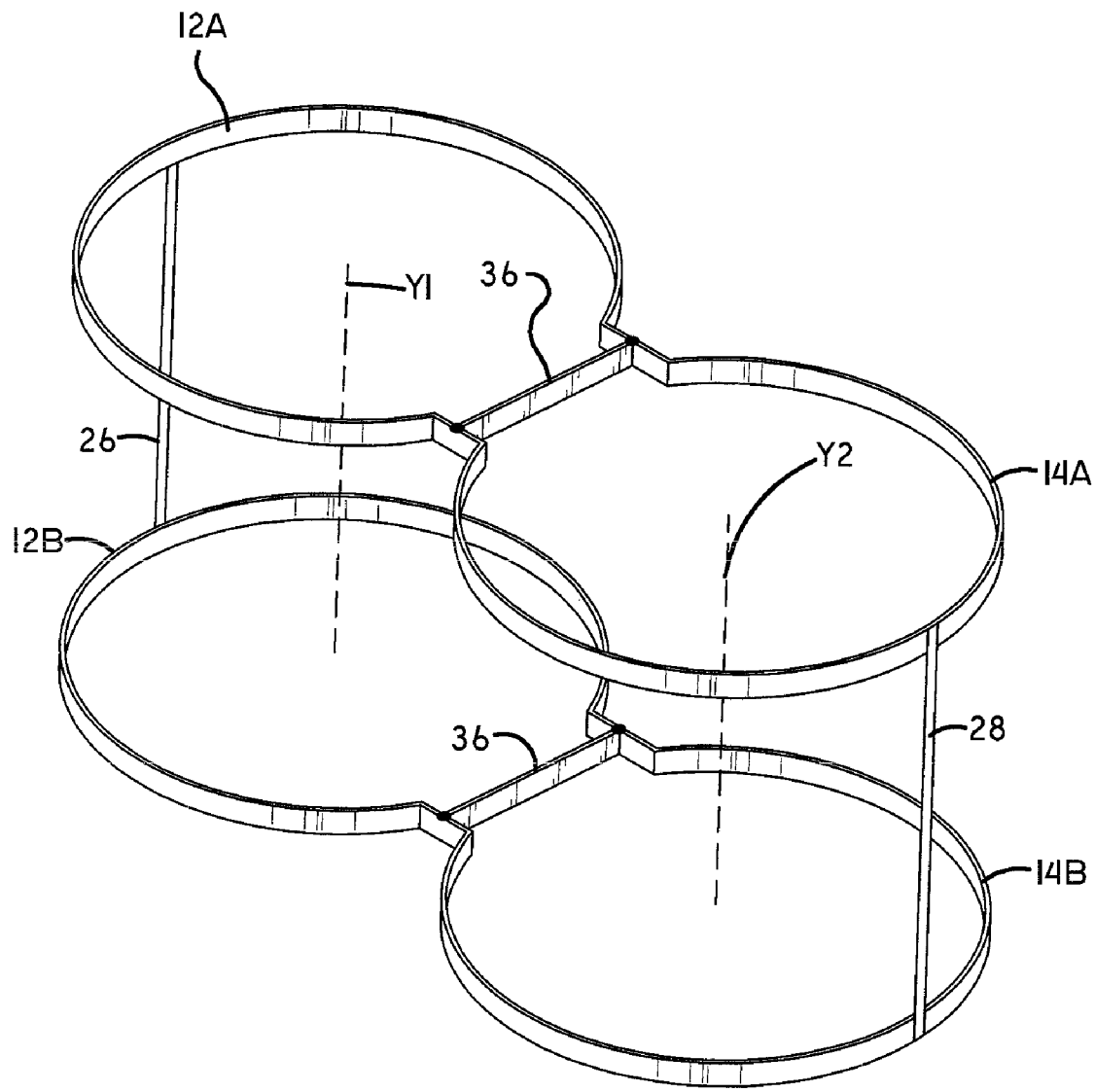
FIG. 11 is a perspective view of an embodiment of the invention showing two pairs of decoupled solenoid element pairs aligned in a coplanar fashion along the two center axis that extend through the center of each solenoid element of each solenoid element pair wherein each pair is decoupled by use of a shared capacitor between the elements of the pair.

In further embodiments of the invention at hand, as illustrated in FIGS. 9-11, solenoid elements 12 and 14 of solenoid element pair 10 are arranged side-by-side on the horizontal x-axis R-L, with at least one shared capacitor 36 connected between solenoid element 12 and solenoid element 14 of solenoid pair 10. The use of shared capacitor 36 allows elements 12 and 14 to remain aligned on the horizontal x-axis R-L, and does not require skewing of the elements off of that axis. Furthermore, the use of shared capacitor 36 allows solenoid elements 12 and 14 to be placed in any relative coplanar position, allowing space and or an angle to exist between them. As is commonly known in the art the shared capacitor is ideally a single capacitor, however numerous capacitors can be placed in combination to create the desired value of the shared capacitance between the elements.

Shared capacitor 36 between elements 12 and 14 improves the isolation between elements 12 and 14 and decreases the coupling that occurs between elements 12 and 14. As is well known within the art, the value of the shared capacitor will vary depending on the specifications of the RF coil in which the element configuration is used, as well as the MRI system in which the RF coil using the element configuration is used.

As is generally known in the art, the total impedance between points A and B, as shown in FIG. 9, can be determined by the following equation:

$$Z_{AB} = j\omega M_{21} + \frac{1}{j\omega C} = j\omega\left(M_{21} - \frac{1}{\omega^2 C}\right)$$

where C is shared capacitor 36. If the effective mutual inductance is defined as $$M_{\mathit{eff}} = M_{21} - \frac{1}{\omega^2 C},$$

then the equation for the inductance between points A and B is equal to $Z_{AB} = j\omega M_{\mathit{eff}}$. In certain embodiments of the present invention, the value of shared capacitor 36 (C) will be chosen such that $$C = \frac{1}{\omega^2 M_{21}},$$

then $M_{\mathit{eff}} = 0$ and element 12 is effectively decoupled from element 14 using shared capacitor 36.

FIG. 9 illustrates an embodiment of the invention wherein single-turn elements 12 and 14 of solenoid pair 10 share capacitor 36. FIG. 10 illustrates an embodiment of the invention wherein three-turn elements 12 and 14 of solenoid pair 10 share capacitor 36.

Figure 12:
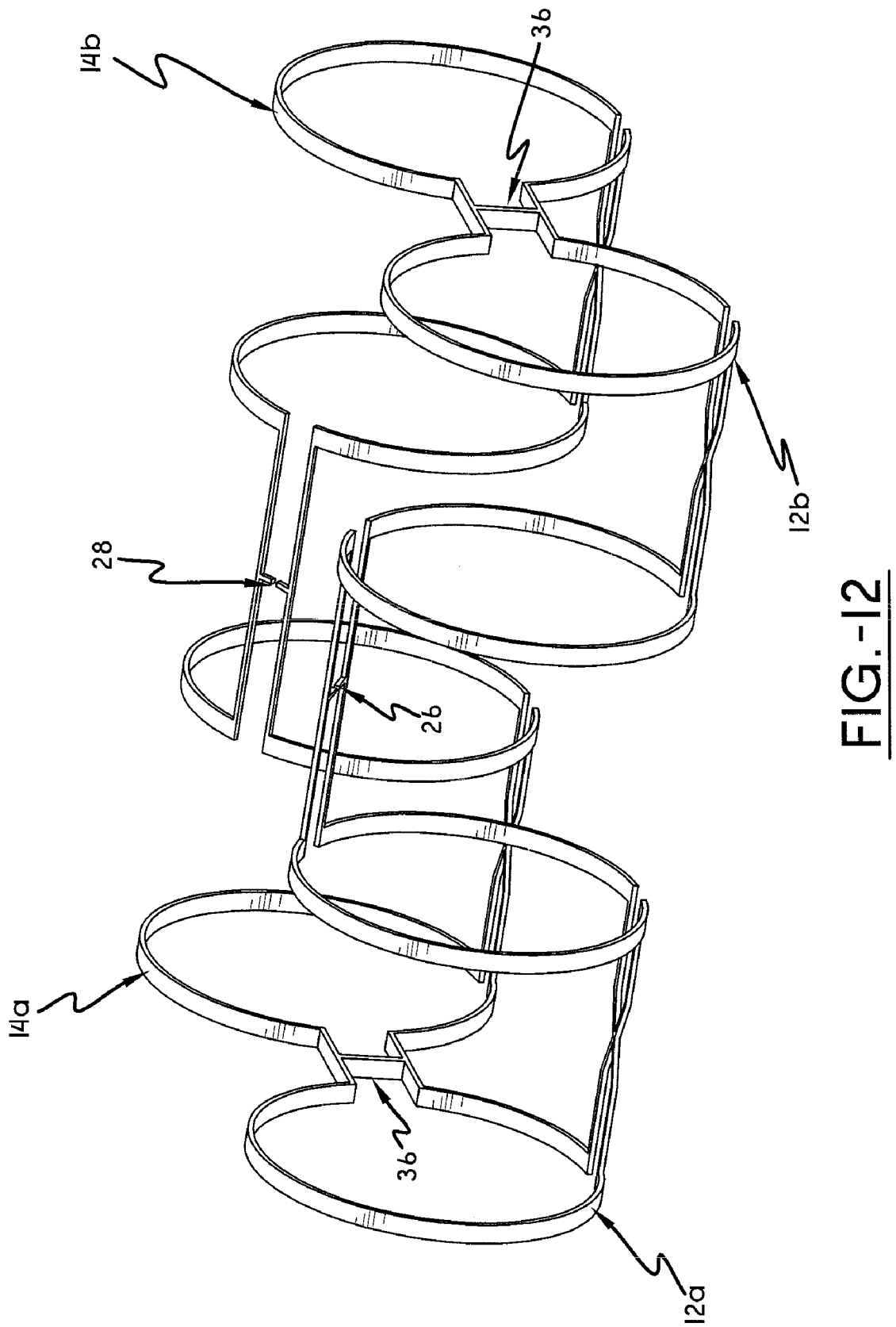
FIG. 12 is a perspective view of an embodiment of the invention showing two pairs of decoupled two-turn solenoid element pairs aligned in a coplanar fashion along the two center axis that extend through the center of each two-turn solenoid element of each solenoid element pair wherein each pair is decoupled by use of a shared capacitor between the elements of the pair.

Similarly to the embodiment using the overlapped area to provide decoupling, It is foreseen by further embodiments of the invention using shared capacitor 36 for decoupling that more than one solenoid element pair 10 may be combined in a coplanar fashion, such as shown in FIGS. 11. The more than one solenoid element pairs 10 may be positioned in a coplanar manner such that the two center axis Y1 and Y2 extend and are shared down the center of each solenoid element that create the solenoid element pair. FIG. 11 illustrates two pairs of decoupled solenoid element pairs aligned in a coplanar fashion along the two center axis Y1 and Y2. When more than one solenoid element pairs are arranged in a coplanar fashion, each solenoid element of each pair may share a capacitor with the solenoid element of the adjacent coplanar pair that is aligned on the same center axis. These shared capacitors are necessary for the decoupling between adjacent coplanar solenoid element pairs. FIG. 11, which illustrates two decoupled solenoid element pairs 10A and 10B, provides for shared capacitor 26 between one set of solenoid elements 12A and 12B of adjacent pairs 10A and 10B and shared capacitor 28 between set of solenoid elements 14A and 14B of adjacent pairs 10A and 10B. While shared capacitor 36 is effective in decoupling the solenoid elements 12 and 14 of the element pair 10, the shared capacitors between the adjacent elements 12A and 12B and 14A and 14B of adjacent solenoid pairs 10A and 10B are necessary to effectively decouple between the elements that share the capacitor between the adjacent pairs. For example, in FIG. 11, shared capacitor 36 effectively decouples element 12A from element 14A, and shared capacitor 26 effectively decouples element 12A from element 12B. Similarly, FIG. 12 further shows an embodiment wherein two pairs of two-turn solenoid elements are aligned in a coplanar fashion.

Figure 13:
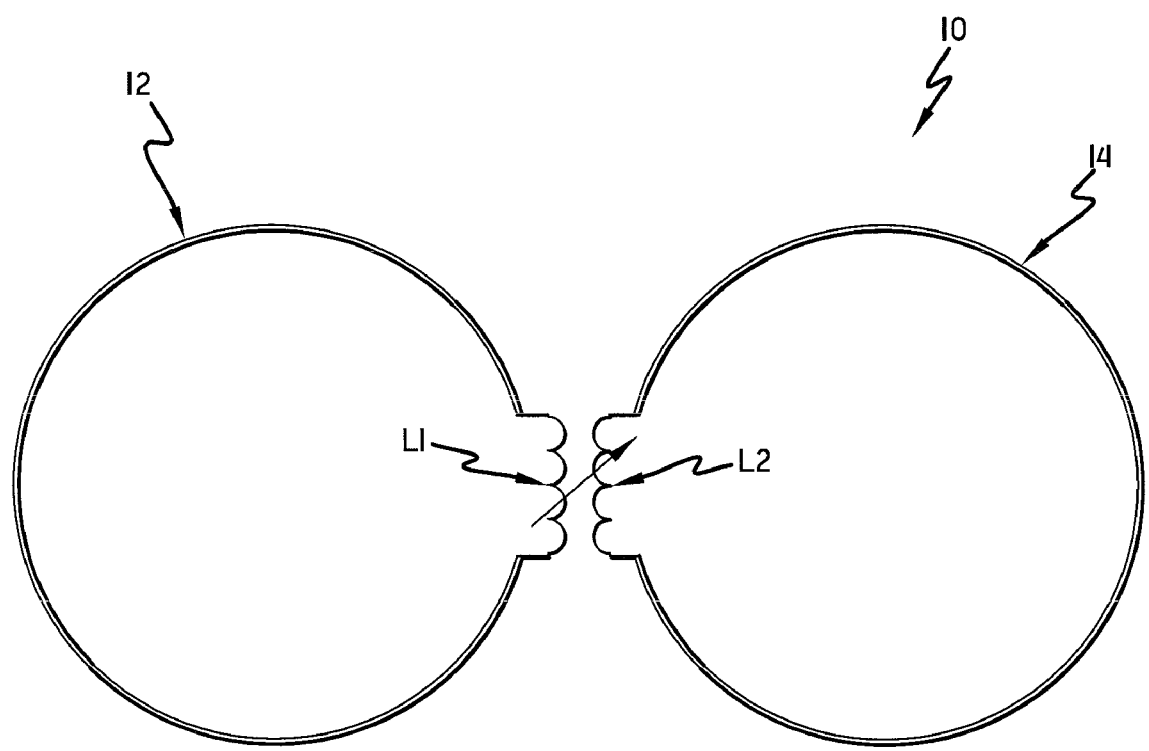
FIG. 13 is a perspective view of an embodiment of the invention showing a decoupled solenoid element pair wherein the pair is decoupled using overlapped inductors between the elements of the pair.

In further embodiments of the invention, elements 12 and 14 of solenoid element pair 10 can be effectively decoupled using at least two overlapped inductors L1 and L2, as shown in FIG. 13. The mutual inductance between elements 12 and 14 of solenoid element pair 10 are dominated by overlapped inductors L1 and L2 positioned between elements 12 and 14. The values of the inductors can be adjusted until the elements 12 and 14 are decoupled from one another. As is commonly known in the art, while ideally two inductors are overlapped, it may be necessary to utilize more inductors in combination to produce the value of inductance desired between the solenoid elements.

Described herein is an element configuration for use in a radiofrequency receive coil designed for use with a vertical field magnetic resonance imaging system which includes a first solenoid element and a second solenoid element positioned generally coplanar to the first solenoid element along a single x-axis. The first solenoid element and the second solenoid element are effectively decoupled from one another. In certain embodiments of the invention the first solenoid element and the second solenoid element are positioned such that an overlapped area exists between the first solenoid element and the second solenoid element to effectively decouple the first solenoid element and the second solenoid element from one another. The overlapped area between the first and second solenoid elements may be created by an overlapping of a portion of the generally circular first and second solenoid elements, by an overlapping of a bulbous extension protruding from the first and second solenoid elements, or by an overlap of at least one bulbous extension protruding from the first or second solenoid element.

In further embodiments of the invention described herein at least one shared capacitor is positioned between the first solenoid element and the second solenoid element to effectively decouple the first solenoid element and the second solenoid element from one another. In other embodiments of the invention at least two overlapped inductors are positioned between the first solenoid element and the second solenoid element to effectively decouple the first solenoid element and the second solenoid element from one another. In all embodiments of the invention the first and second solenoid elements may be single turn solenoid elements or multi-turn solenoid elements.

It is foreseen by this invention that further methods of decoupling the elements can be used, as they become known within the art. Any method of decoupling known within the art can be used, and there are no limits to the method of decoupling used to isolate the elements of the solenoid pair when placed in a coplanar, side-by-side position.

In the foregoing description, certain terms have been used for brevity, clearness, illustration and understanding; but no unnecessary limitations are to be implied therefrom beyond the requirements of the prior art, because such terms are used for descriptive purposes and are intended to be broadly construed. Moreover, this invention has been described in detail with reference to specific embodiments thereof, including the respective best modes for carrying out each embodiment. It shall be understood that these illustrations are by way of example and not by way of limitation.

What is claimed is:

1. An element configuration for use in a radiofrequency receive coil designed for use with a vertical field magnetic resonance imaging system which comprises:
   a first solenoid element; and
   a second solenoid element positioned generally coplanar to said first solenoid element along an axial plane;
   wherein said first solenoid element and said second solenoid element are effectively decoupled from one another.

2. The element configuration of claim 1 wherein
   said first solenoid element and said second solenoid element are single turn solenoid elements.

3. The element configuration of claim 1 wherein
   said first solenoid element and said second solenoid element are multi-turn solenoid elements.

4. The element configuration of claim 3 wherein said first multi-turn solenoid element and
   said second multi-turn solenoid element are counter-wound solenoid elements.

5. The element configuration of claim 1 wherein
   said decoupling is accomplished by creating an overlapped area between said first solenoid element and said second solenoid element.

6. The element configuration of claim 5 wherein
   said overlapped area is created by a bulbous extension protruding from said first solenoid element and a bulbous extension protruding from said second solenoid element.

7. The element configuration of claim 5 wherein
   said overlapped area is created by at least one bulbous extension protruding from said first solenoid element or said second solenoid element.

8. The element configuration of claim 5 wherein
   said overlapped area is created by a portion of said first solenoid element and a portion of said second solenoid element wherein said first solenoid element and said second solenoid element are generally circular in shape.

9. The element configuration of claim 1 wherein
   said decoupling is accomplished by the placement of at least one shared capacitor between said first solenoid element and said second solenoid element.

10. The element configuration of claim 1 wherein
    said decoupling is accomplished by the placement of at least two overlapping inductors between said first solenoid element and said second solenoid element.

11. An element configuration for use in a radiofrequency receive coil designed for use with a vertical field magnetic resonance imaging system which comprises:
    a first solenoid element; and
    a second solenoid element positioned generally coplanar to said first solenoid element along an axial plane;
    wherein said first solenoid element and said second solenoid element are positioned such that an overlapped area exists between said first solenoid element and said second solenoid element to effectively decouple said first solenoid element and said second solenoid element from one another.

12. The element configuration of claim 11 wherein
    said first solenoid element and said second solenoid element are single turn solenoid elements.

13. The element configuration of claim 11 wherein
    said first solenoid element and said second solenoid element are multi-turn solenoid elements.

14. The element configuration of claim 13 wherein
    said first multi-turn solenoid element and said second multi-turn solenoid element are counter-wound solenoid elements.

15. The element configuration of claim 11 wherein
    said overlapped area is created by a bulbous extension protruding from said first solenoid element and a bulbous extension protruding from said second solenoid element.

16. The element configuration of claim 11 wherein said overlapped area is created by at least one bulbous extension protruding from said first solenoid element or said second solenoid element.

17. The element configuration of claim 11 wherein said overlapped area is created by a portion of said first solenoid element and a portion of said second solenoid element wherein said first solenoid element and said second solenoid element are generally circular in shape.

18. An element configuration for use in a radiofrequency receive coil designed for use with a vertical field magnetic resonance imaging system which comprises:
a first solenoid element; and
a second solenoid element positioned generally coplanar to said first solenoid element along an axial plane;
wherein at least one shared capacitor is positioned between said first solenoid element and said second solenoid element to effectively decouple said first solenoid element and said second solenoid element from one another.

19. The element configuration of claim 18 wherein said first solenoid element and said second solenoid element are single turn solenoid elements.

20. The element configuration of claim 18 wherein said first solenoid element and said second solenoid element are multi-turn solenoid elements.

21. The element configuration of claim 20 wherein said first multi-turn solenoid element and said second multi-turn solenoid element are counter-wound solenoid elements.

22. An element configuration for use in a radiofrequency receive coil designed for use with a vertical field magnetic resonance imaging system which comprises:
a first solenoid element; and
a second solenoid element positioned generally coplanar to said first solenoid element along an axial plane;
wherein at least two overlapped inductors are positioned between said first solenoid element and said second solenoid element to effectively decouple said first solenoid element and said second solenoid element from one another.

23. The element configuration of claim 22 wherein said first solenoid element and said second solenoid element are single turn solenoid elements.

24. The element configuration of claim 22 wherein said first solenoid element and said second solenoid element are multi-turn solenoid elements.

25. The element configuration of claim 24 wherein said first multi-turn solenoid element and said second multi-turn solenoid element are counter-wound solenoid elements.

* * * * *